VOLTAGE DEPENDENT SEMICONDUCTOR CAPACITOR OF MESA TYPE

Filed Dec. 4, 1967

United States Patent Office 3,487,272

Patented Dec. 30, 1969

3,487,272

VOLTAGE DEPENDENT SEMICONDUCTOR CAPACITOR OF MESA TYPE

Karl Siebertz, Munich-Obermenzing, and Ernst Hofmeister, Munich, Germany, assignors to Siemens Aktiengesellschaft, a corporation of Germany Filed Dec. 4, 1967, Ser. No. 687,761

Claims priority, application Germany, Dec. 22, 1966, S 107,543

Int. Cl. H01l 3/00, 5/00, 7/00

U.S. Cl. 317—234 9 Claims

ABSTRACT OF THE DISCLOSURE

A semiconductor body has a base zone of determined conductivity type. A plurality of mesa zones of the opposite conductivity type project from the base zone. Each of the mesa zones forms a p-n junction and therefore a diode with the base zone. The mesa zones are electrically connected in parallel thereby electrically connecting the diodes formed by the mesa zones and the base zone in parallel. The diodes are biased in the reverse direction.

Figure 1:
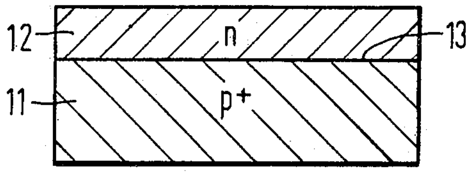

The present invention relates to a voltage dependent semiconductor capacitor. More particularly, the invention relates to a voltage dependent semiconductor capacitor of mesa type. The semiconductor capacitor of the present invention comprises a p-n junction and is operated in the reverse direction.

The voltage dependent capacitance in the space charge region of a p-n junction is utilized as a controllable capacitor. When the semiconductor capacitor is utilized for high frequency tuners of parametric amplifiers, for example, it is desirable that the capacitance be closely dependent upon the applied voltage. In known semiconductor capacitors, in order to make the capacitance more closely dependent upon the applied voltage, the area of the space charge region of the p-n junction is designed geometrically in a manner whereby when the applied voltage is increased in magnitude, the space charge region moves to a region having a smaller cross-section. Since the capacitance of a p-n junction operated or biased in the reverse direction decreases as the magnitude of the blocking voltage increases, the capacitance decreases further, when the cross-section is decreased. This may be illustrated by an example in which a disc or plate capacitor is the base for the p-n. In such case, the area of the capacitor plate or disc is decreased as the cross-section of the area of the space charge region is decreased.

In a mesa diode, the cross-section of the area of the space charge region is decreased on at least one side of the p-n junction, since the cross-sectional area of the mesa zone projection decreases as its distance from the base zone increases. If the capacitance is to be very closely dependent upon the applied voltage, the slope of the mesa zone projection must be decreased in angle. If, for example, the mesa zone projection is 200 micrometers in diameter and has a slope of 9°, the capacitance is more closely dependent upon the applied voltage, relative to a cylindrical path region, by a factor of 2. In a practical application, the magnitude of an expansion area of the space charge region of 6 micrometers is assumed to be —60 volts at an applied voltage variation of —2 volts. It is very difficult to produce mesa diodes having small or shallow slopes, since it is practically impossible to etch such diodes.

The principal object of the present invention is to provide a new and improved voltage dependent semiconductor capacitor of mesa type. The semiconductor capacitor of the present invention has a capacitance which is very closely dependent upon the applied voltage. The semiconductor capacitor of the present invention overcomes the difficulties of semiconductor capacitors of the prior art. The semiconductor capacitor of the present invention functions with efficiency, effectiveness and reliability and is simple in structure.

In accordance with the present invention, a voltage dependent semiconductor capacitor comprises a semiconductor body having a base zone of determined conductivity type and a plurality of mesa zones of the opposite conductivity type projecting from the base zone. Each of the mesa zones forms a p-n junction and therefore a diode with the base zone. A connector connected to each of the mesa zones electrically connects the mesa zones in parallel thereby electrically connecting the diodes formed by the mesa zones and the base zone in parallel. A biasing circuit in electrical contact with the mesa zones and in electrical contact with the base zone biases the diodes in the reverse direction.

The base zone is of p conductivity type and is highly doped relative to said mesa zones. A plurality of spaced pedestals are formed in and extend from the base zone and each of the mesa zones forms a p-n junction with and projects from a corresponding one of the pedestals whereby each of the mesa zones is isolated from the others. The connector comprises an electrode in electrical contact with each of the mesa zones and electrical conductors interconnecting the electrodes in parallel. The biasing circuit includes an electrically conductive lead connected to the electrode of one of the mesa zones and an electrode in electrical contact with the base zone.

In accordance with the present invention, a method of making a voltage dependent semiconductor capacitor comprises doping a semiconductor body of a determined conductivity type to provide a zone of opposite conductivity type in the semiconductor body thereby forming a p-n junction between the zone of determined conductivity type and the zone of opposite conductivity type. The zone of opposite conductivity type and a small adjacent portion of the zone of determined conductivity type are etched to provide a plurality of mesa zones of the opposite conductivity type projecting from the zone of determined conductivity type. The mesa zones are electrically connected to each other in parallel. The mesa zones and the zone of determined conductivity type are biased in the reverse direction. The zone of determined conductivity type is highly doped relative to the mesa zones and the determined conductivity type is p conductivity type.

Figure 2:
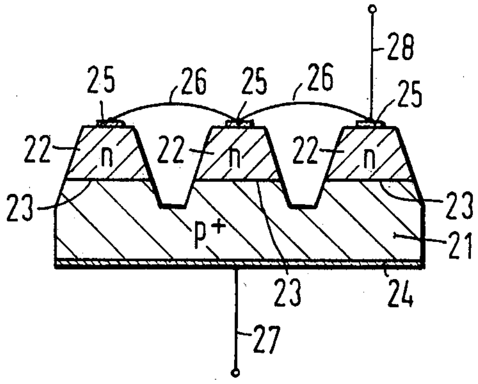

In order that the invention may be readily carried into effect, it will now be described with reference to the accompanying drawing, wherein:

FIG. 1 is a sectional side view of a semiconductor body utilized to produce the semiconductor capacitor of the present invention; and FIG. 2 is a sectional side view of an embodiment of the semiconductor capacitor of the present invention.

In FIG. 1, the semiconductor body comprises a base zone or substrate 11 of p+ conductivity type and an additional or mesa zone 12 of n conductivity type. The mesa zone 12 may be provided by any suitable means such as, for example, epitaxial or diffusion methods, or the like, and forms a p-n junction 13 with the base zone 11. The p+ conductivity type indicates herein that the conductivity of the base zone 11 is so great compared to the conductivity of the mesa zone 12 that the space charge region in the area of the p-n junction 13 is practically exclusively limited to the mesa zone 12.

The semiconductor capacitor of the present invention of FIG. 2 is produced from the semiconductor body of FIG. 1. In FIG. 2, the p+ conductivity type base zone or substrate 21 is the same as the base zone 11 of FIG. 1, the n conductivity type mesa zone 22 is the same as the mesa zone 12 of FIG. 1 and the p-n junction 23 is the same as the p-n junction of FIG. 1. The mesa zone 22 is etched in a manner whereby a plurality of mesa zone projections 22 are provided. Each of the mesa zone projections 22 projects from the base zone 21. Actually, the etching operation produces a plurality of spaced pedestals formed in and extending from the base zone 21, and each of the mesa zones 22 forms a p-n junction 23 with and projects from a corresponding one of said pedestals. Each of the mesa zones 22 is thus isolated from the others.

An electrode 24 is provided in electrical contact with the base zone 21. An electrode 25 is provided in electrical contact with each of the mesa zones 22. Electrical conductors 26 are electrically connected to the electrodes 25 and interconnect said electrodes in parallel. Each mesa zone projection 22 forms a diode with the base zone 21 and the electrical conductors 26 connect all the diodes in parallel. An electrical conductor 27 is electrically connected to the electrode 24 and an electrical conductor 28 is electrically connected to one of the electrodes 25. The diodes formed by the mesa zones 22 and the base zone 21 are biased in the reverse direction by any suitable source of electrical energy such as, for example, a battery, connected to the leads 27 and 28, and not shown in the figures.

In the semiconductor capacitor of the present invention, each of the mesa zone projections 22 varies uniformly in cross-sectional area, so that an increase of the space charge permits a considerably greater variation of area, in total, than in prior art devices. In accordance with the foregoing numerical example, the same area is provided if the initial mesa zone 12, which has a diameter of 200 micrometers, is divided into 25 mesa zone projections 22, each of which has a diameter of 40 micrometers. The area is thereby decreased by 40%, and the decrease in area is indicated by an additional variation of capacitance of the same magnitude. If the slope of each of the mesa zones 22 is 60° and if the slope of the mesa zone 12 is 60°, then, if the diameter of the mesa zone 12 is 200 micrometers, the decrease in area in a semiconductor capacitor having a single mesa zone projection 12 is only 6%.

The embodiment of the invention illustrated in FIG. 2 is shown schematically only. It is preferable, in view of the losses, to highly dope the farther portions from the base zone of the mesa zone projections 22 and to slightly dope the closer portions from said base zone of said mesa zone projections. The space charge region moves to such closer portions of the mesa zone projections 22. The doping of the mesa zone projections 22 may be accomplished by any suitable means such as, for example, n epitaxy on a p+ substrate disc, or by diffusion of the planar surfaces of the disc, or the like.

The mesa zone projections 22 may be interconnected by an electrically conductive foil which may be suitably electrically connected to each of said projections by, for example, thermal compression, soldering or by oxidation of the entire surface. The mesa zone projections 22 may also be interconnected by forming contact areas in the projections and forming notches therein by, for example, a photo varnishing method and vaporization of the entire surface.

While the invention has been described by means of a specific example and in a specific embodiment, we do not wish to be limited thereto, for obvious modifications will occur to those skilled in the art without departing from the spirit and scope of the invention.

We claim:

1. A voltage dependent semiconductor capacitor comprising:

a semiconductor body having a base zone of determined conductivity type and a plurality of mesa zones of the opposite conductivity type projecting from said base zone, each of said mesa zones forming a p-n junction diode with said base zone;

connecting means connected to each of said mesa zones for electrically connecting said mesa zones in parallel and the diodes formed by said mesa zones and said base zone in parallel; and biasing means in electrical contact with said mesa zones and in electrical contact with said base zone for biasing said diodes in the reverse direction.

2. A voltage dependent semiconductor capacitor as claimed in claim 1, wherein said base zone is of p conductivity type.

3. A voltage dependent semiconductor capacitor as claimed in claim 1, wherein said base zone is highly doped relative to said mesa zones.

4. A voltage dependent semiconductor capacitor as claimed in claim 1, further comprising a plurality of spaced pedestals formed in and extending from said base zone and wherein each of said mesa zones forms a p-n junction with and projects from a corresponding one of said pedestals whereby each of said mesa zones is isolated from the others.

5. A voltage dependent semiconductor capacitor as claimed in claim 1, wherein said connecting means comprises an electrode in electrical contact with each of said mesa zones and electrical conductor means interconnecting the electrodes in parallel, and said biasing means includes an electrically conductive lead connected to the electrode of one of said mesa zones and an electrode in electrical contact with said base zone.

6. A voltage dependent semiconductor capacitor as claimed in claim 4, wherein said base zone is of p conductivity type and is highly doped relative to said mesa zones, said connecting means comprises an electrode in electrical contact with each of said mesa zones and electrical conductor means interconnecting the electrodes in parallel, and said biasing means includes an electrically conductive lead connected to the electrode of one of said mesa zones and an electrode in electrical contact with said base zone.

7. A method of making a voltage dependent semiconductor capacitor, comprising the steps of doping a semiconductor body of a determined conductivity type to provide a zone of opposite conductivity type in the semiconductor body thereby forming a p-n junction between the zone of determined conductivity type and the zone of opposite conductivity type;

etching through the zone of opposite conductivity type and a small adjacent portion of the zone of determined conductivity type to provide a plurality of mesa zones of said opposite conductivity type projecting from said zone of determined conductivity type; and electrically connecting said mesa zones to each other in parallel; and biasing said mesa zones and said zone of determined conductivity type in the reverse direction.

8. A method of making a voltage dependent semiconductor capacitor as claimed in claim 7, further comprising highly doping said zone of determined conductivity type relative to said mesa zones.

9. A method of making a voltage dependent semiconductor capacitor as claimed in claim 7, wherein said determined conductivity type is p conductivity type.

References Cited

UNITED STATES PATENTS

| | | | |
|---|---|---|---|
| 2,985,805 | 5/1961 | Nelson | 317—235 |
| 3,150,999 | 9/1964 | Rudenberg et al. | 317—234 X |
| 3,274,461 | 9/1966 | Teszner | 317—235 |
| 3,309,553 | 3/1967 | Kroemer | 317—234 X |

JAMES D. KALLAM, Primary Examiner

U.S. Cl. X.R.

29—576